(12) United States Patent
Helmstetter et al.

(10) Patent No.: US 6,404,645 B1
(45) Date of Patent: Jun. 11, 2002

(54) SYSTEM FOR SUPPORTING ELECTRONIC COMPONENTS

(75) Inventors: Chris M. Helmstetter, Bridgewater; Jason A. Kay, Morristown; David S. Kerr, Morris Plains, all of NJ (US); Ronald Marchisin, Toby Hanna; Ivan Pawlenko, Holland, both of PA (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/515,103

(22) Filed: Feb. 29, 2000

(51) Int. Cl.$^7$ .................................................. H05K 5/00
(52) U.S. Cl. ...................... 361/752; 361/759; 361/730; 439/948; 439/74; 0741/35 R; 0741/255
(58) Field of Search ............................... 361/752, 308.3, 361/610, 719, 730, 736, 742, 758, 800, 759; 174/35 R, 44, 60, 255, 206; 439/842, 851, 948, 74; 29/760

(56) References Cited

U.S. PATENT DOCUMENTS

| | | | |
|---|---|---|---|
| 4,409,641 A | * 10/1983 | Jakob et al. ................ 361/386 |
| 4,741,032 A | 4/1988 | Hampton ..................... 439/409 |
| 4,910,770 A | 3/1990 | Collins et al. ............... 379/399 |
| 5,233,501 A | * 8/1993 | Allen et al. .................. 361/733 |
| 5,243,498 A | * 9/1993 | Scofield ....................... 361/767 |
| 5,519,331 A | * 5/1996 | Cowart et al. ............... 324/755 |
| 5,521,793 A | * 5/1996 | Dalgleish et al. ........... 361/752 |
| 5,844,781 A | * 12/1998 | Schlotterer et al. ......... 361/752 |
| 5,932,065 A | * 8/1999 | Mitchell ....................... 29/760 |
| 5,978,472 A | 11/1999 | Tuvy et al. .................. 379/399 |
| 5,993,243 A | 11/1999 | Daoud ......................... 439/409 |
| 6,094,056 A | * 7/2000 | Bardsley et al. ............ 324/754 |

* cited by examiner

Primary Examiner—David Martin
Assistant Examiner—Hung Bui

(57) ABSTRACT

An apparatus and method for containing and supporting electronic components during electrical connection are described. The apparatus is a housing which includes a main body, a cover and a back member. A base is attached to the back member. The base includes sockets in a grid pattern. Movable elements having protrusions for insertion into the sockets are mounted on the base to provide support to a circuit board, which itself is attached to the base through mounting studs and guide posts. The moveable elements can be relocated on the base.

24 Claims, 2 Drawing Sheets

SYSTEM FOR SUPPORTING ELECTRONIC COMPONENTS

BACKGROUND

The present invention relates generally to electronic devices, and more particularly to an apparatus for containing and supporting electronic components, such as a circuit board, mounted on support substrates.

Circuit boards are employed in many electronic systems, including communication networks, and allow for enhanced communication features. However, they can be sensitive to moisture, temperature change, material stress, physical degradation, insects, and rodents. They may have to be protected by a suitable housing apparatus to function properly.

Known housing structures for supporting and containing printed circuit boards are built to a prescribed configuration with very limited flexibility. Once the printed circuit board (PCB) and associated components are mounted within the housing structure, the PCB may be connected to an electronic system, such as, for example, a communication network. Generally, the PCB is connected to the network through wires inserted into insulation displacement connectors located on the PCB. A problem sometimes encountered is that the PCB can be damaged or broken by the stress associated with inserting a communication wire into the connector. It is estimated that between about 15 to about 20 pounds of pressure is used to insert communication wires into the connectors. The known board housings provide insufficient support structures for the PCB. Further, known board housings provide little flexibility in modifying the support structures, and thus major changes in the shape or configuration of the printed circuit boards require replacement of the associated housing. Either replacement or modification of the housing results in inefficiencies and increased installation costs.

There exists a need for a more flexible housing apparatus which can be easily adapted to receive a variety of boards and associated electronic components.

SUMMARY

The present invention provides a supporting device for use in a network interface device having a printed circuit board and being housed in a housing apparatus. The supporting device includes a base having a plurality of sockets, and one or more elements, each element having a protrusion for insertion into a respective socket. The elements are adapted to support the printed circuit board and inhibit damage due to physical stress caused by connecting wires into the printed circuit board.

The present invention further provides an apparatus for containing and supporting a circuit board. The apparatus includes a housing having a main body, a cover, and a back member, a base attached to the back member, and a plurality of movable elements for engaging with said sockets, said movable elements adapted to support a circuit board. The base includes a plurality of sockets.

The present invention further provides a network interface device which includes a housing having a main body, a cover, and a back member, a base attached to the back member, a plurality of movable elements for engaging with the sockets, a circuit board supported on the base with one or more fastening mechanisms, and incoming and outgoing communication cables. The base includes a plurality of sockets. The incoming cables may include one or more wires which are electrically connected to the circuit board. The movable elements may be used to provide support to the circuit board while the wires are being electrically connected to the circuit board.

The present invention further provides a method of installing a network interface device to a structure. The method includes the steps of securing a housing to a structure, securing one or more movable elements into sockets in the base, securing a circuit board to the base with one or more fastening mechanisms, and connecting communication wires to the circuit board, wherein the movable elements are so located as to inhibit stress on the circuit board during the connection step.

The above and other advantages and features of the invention will be more clearly understood from the following detailed description of the invention, which is provided in connection with the accompanying drawings.

DETAILED DESCRIPTION OF PREFERRED EMBODIMENTS

While the invention is susceptible to various modifications and alternative forms, an exemplary embodiment will now be described in detail. It should be understood, however, that the invention is not limited to the exemplary embodiments discussed herein. Instead, the invention covers all modifications, equivalents, and alternatives falling within the spirit and scope of the appended claims. The present invention will now be described with relation to an embodiment for use with a residential communication network interface printed circuit board.

Figure 1:
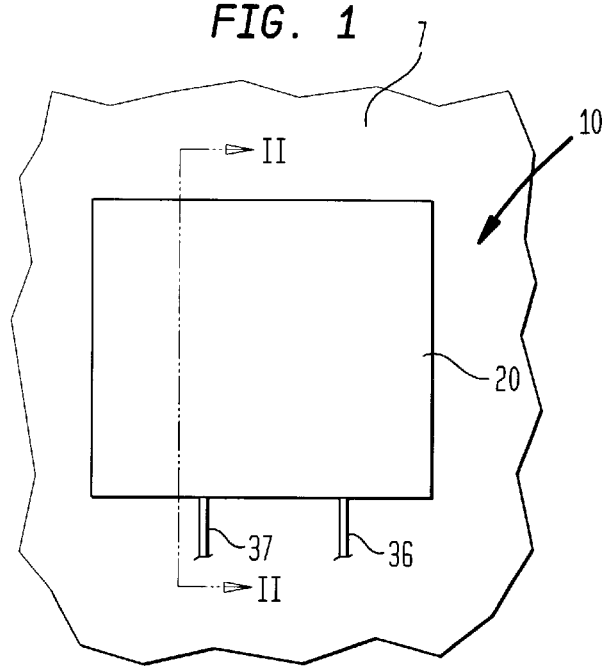
FIG. 1 is a front view of a housing apparatus constructed in accordance with an embodiment of the present invention.
Figure 2:
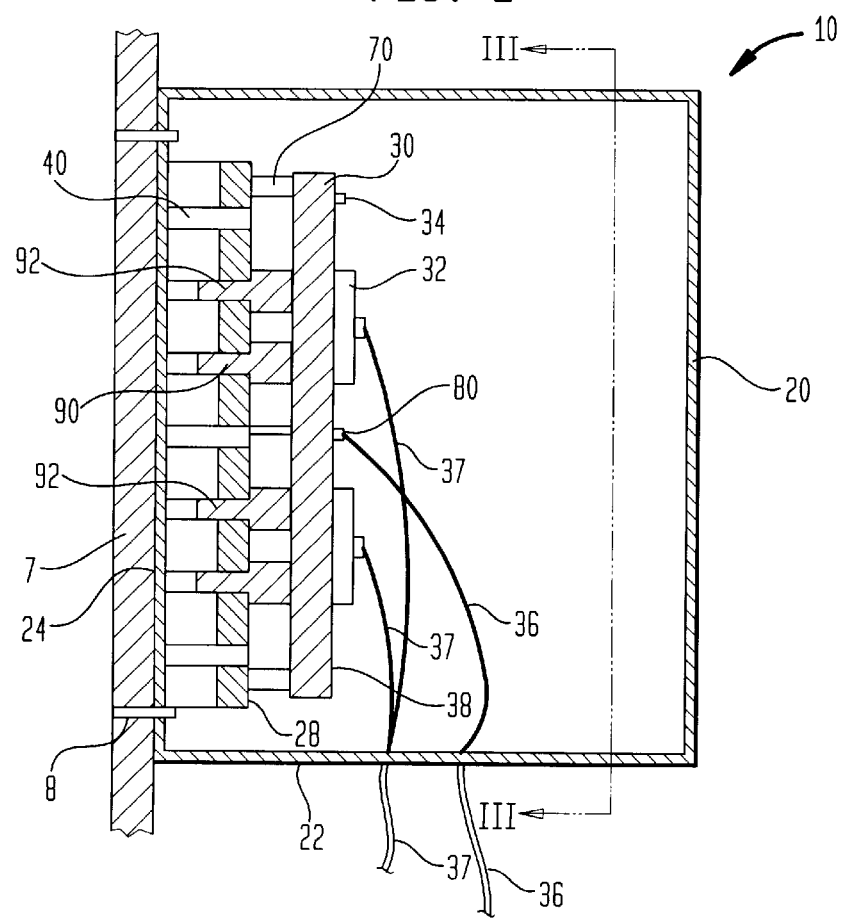
FIG. 2 is a cross-sectional view of the apparatus taken along the line II—II of FIG. 1.

Referring now to the drawings, where like reference numerals designate like elements, there is shown a housing apparatus 10 mounted to a structure 7. The structure 7 may be a residence or a business, and may be formed of any suitable building material, such as, for example, brick, concrete, wood, and siding. The housing apparatus 10 includes a cover 20 which preferably is connected to a main body 22 (FIG. 2). A back member 24 of the main body 22 is attached to the structure 7 by suitable fasteners 8. The housing apparatus 10 contains and supports a circuit board 30 (FIG. 2). The circuit board 30 may be any suitable connection interface, such as a printed wiring board for use in a network interface device. An input cable 37 from a network system and including one or more input wires 37 is inserted through the lower portion of the main body 22. An output cable 36 is shown exiting the lower portion of the main body 22 for the structure 7.

A base 28 is attached to the back member 24. Preferably, the base 28 is integrally formed on the back member 24. The base 28 includes a plurality of sockets 40. The sockets 40 may be arranged in a grid arrangement. The circuit board 30 is removably attached to the base 28. As shown in FIG. 2, board mounting studs 70 are positioned between the base 28 and the circuit board 30. The circuit board 30 is connected to the mounting studs 70 by mechanical fasteners 34 inserted through a face 38 of the circuit board 30. One or more guide posts 80 (FIG. 3) further secure the printed circuit board 30 to the base 28. The guide posts 80 frictionally retain and extend over the face 38 of the board 30. The output cables 36 may be connected to the guide posts 80.

Movable support elements 90 may be inserted into the sockets 40. The support elements 90, which protrude from the base 28, provide support to the circuit board 30 during insertion of the input wires 37. Insulation displacement connectors 32 are secured to the face 38 of the circuit board 30. The input wires 37 are inserted through the connectors 32 to create an electrical circuit.

Figure 3:
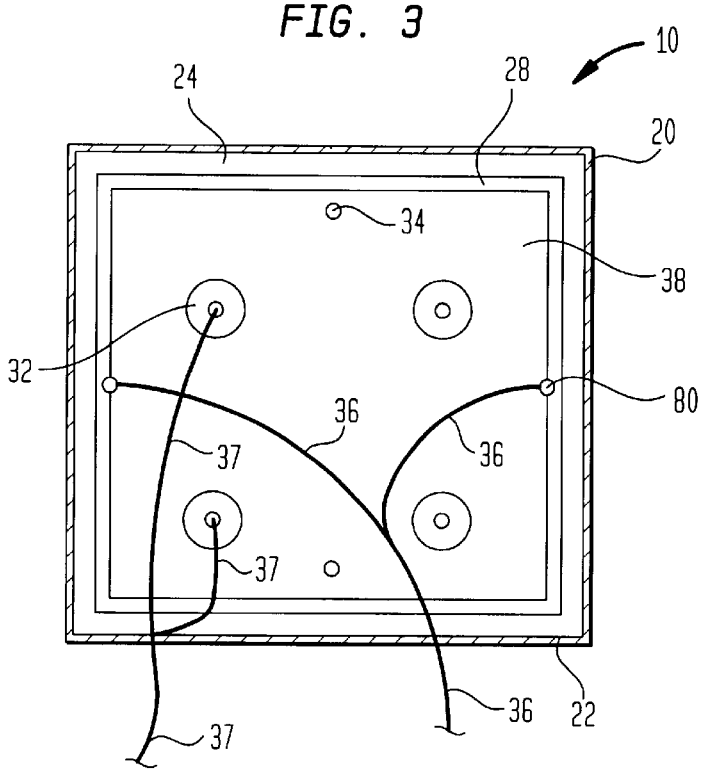
FIG. 3 is another cross-sectional view of the apparatus taken along the line III—III of FIG. 2.
Figure 4:
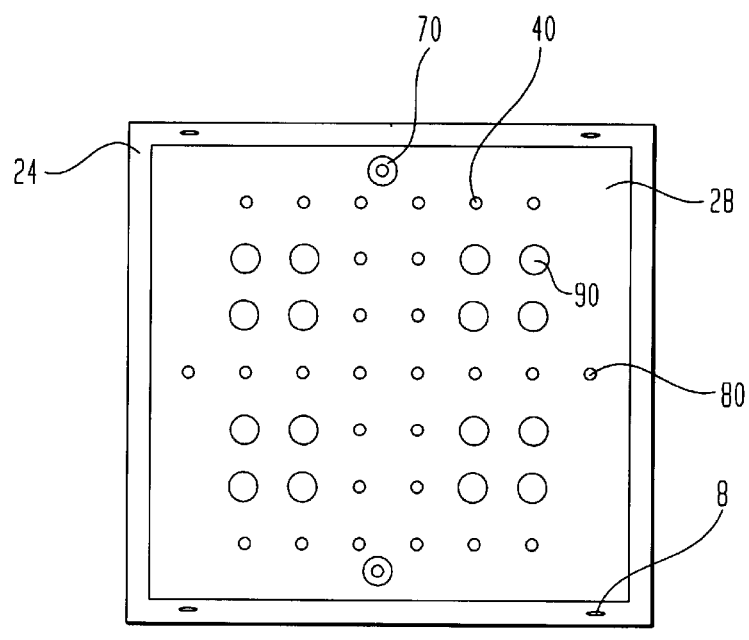
FIG. 4 is a top view of a base of the apparatus of FIG. 1.

As noted above, the base 28 contains an array of the sockets 40. In FIG. 4, four groupings of four movable support elements 90 each are shown inserted into the base 28. Specifically, each support element 90 is inserted into a respective socket 40. The positioning of the support elements 90 is determined by the positioning of the connectors 32 on the circuit board 30. Thus, if four connectors 32 are necessary for the electrical connections and they are placed in the locations as shown in FIG. 3, the four groupings of support elements 90 are so positioned to provide support for the circuit board 30 at the position most in need of it, namely where the force will be exerted in order to insert the input wires 37 into the connectors 32.

Figure 5:
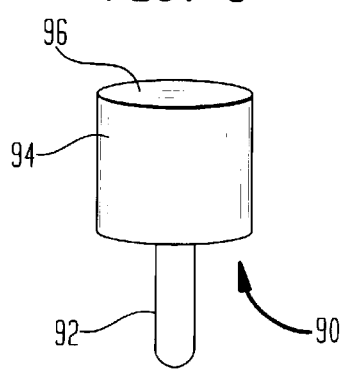
FIG. 5 is a perspective view of a movable support element constructed in accordance with an embodiment of the present invention.

FIG. 5 shows a movable support element 90. The element 90 consists of a projecting portion 92, which is to be received in a complementary socket 40 (FIG. 2), an upper portion 94, and a top surface 96. The support element 90 is configured and dimensioned to ensure that it has sufficient length to support the printed circuit board 30 during insertion of the input wires 37.

In operation the main body 22 can be mounted to a structure 7 for installation of a communication network interface. The installer mounts the back member 24 of the main body 22 of the housing apparatus 10 to the structure 7 with the fasteners 8. Then, the movable support elements 90 are positioned on the base 28 in locations adjacent to the area where terminal connections will be made on the face 38 of the printed circuit board 30 during installation of the input wires 37 into the connectors 32. The printed circuit board 30 is then placed on top of the mounting studs 70 and on the top surface 96 of the movable support elements 90 and between the guide posts 80. Mechanical fasteners 34, such as screws, are then inserted through the board 30 and into the mounting studs 70. Next, the input wires 37 are inserted by pressure into the insulation displacement connectors 32 located on the face 38 of the printed circuit board 30. Due to the location of the movable support elements 90, which underlie and support the printed circuit board 30, the risk of damaging or breaking the printed circuit board 30 during insertion of the input wires 37 is diminished. Connections are then made from the guide posts 80 with the output wires 36 leading from the housing apparatus 10 through the structure 7. As a final step, the cover 20 is tightly closed over the main body 22.

Because the housing apparatus 10 will house electronic components, such as communications components, it is highly desirable that the main body 22, base 28, cover 20, mounting studs 70, guide posts 80, and movable support elements 90 be made of non-conductive material. To reduce the cost and weight of the housing apparatus 10, the main body 22, base 28, cover 20, mounting studs 70, and guide posts 80 can be made of molded plastic. A preferred material for the movable support elements 90 is nylon as it allows the support elements 90 to fit tightly into the sockets 40. This results in the support elements 90 being held by friction or compression within the sockets 40.

Through such an arrangement, the printed circuit board 30 is protected from physical stress during insertion of the input wires 37. Further, if an upgrade of the connections becomes necessary, the upgrade can be easily accomplished by removing the printed circuit board 30 from the housing apparatus 10, positioning additional insulation displacement connectors 32 on the board 30, and inserting additional support elements 90 in appropriate locations on the base 28. With the additional support elements 90 in place on the base 28, the circuit board 30 is repositioned over and mechanically fastened to the base 28.

While the foregoing has described in detail preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the sockets 40 are shown to extend through the base 28 to the back member 24, instead the sockets may extend only partially through the base 28. Accordingly, the invention is not to be seen as limited by the foregoing description, but is only limited by the scope of the appended claims.

What is claimed as new and desired to be protected by Letters Patent of the United States is:

1. A supporting device for use in a network interface device having a circuit board, said supporting device comprising:
   a base including a plurality of sockets; and
   one or more removable insertion elements provided separate from said base and said circuit board, each said element having a projection dimensioned to be inserted into a respective said socket, wherein said elements have surfaces for contacting and supporting the circuit board to inhibit damage due to physical stress caused by connecting wires to the circuit board.

2. The supporting device of claim 1, wherein said base comprises a non-conductive material.

3. The supporting device of claim 2, wherein said non-conductive material comprises a plastic material.

4. The supporting device of claim 3, wherein said plastic material is nylon.

5. The supporting device of claim 1, wherein said sockets are arranged in a grid pattern.

6. An apparatus for containing a circuit board, comprising:
   a housing having a main body, a cover, and a back member;
   a base attached to said back member, said base including a plurality of sockets; and
   a plurality of movable elements provided separate from said base and said circuit board so as to be selectively inserted into selected ones of said sockets, for engaging with said sockets, said movable elements adapted to support said circuit board,
   wherein said movable elements each include projections dimensioned to be inserted into said sockets.

7. The apparatus of claim 6, further comprising fastening mechanisms for securing the circuit board to said base.

8. The apparatus of claim 7, wherein said fastening mechanisms include mounting studs and guide posts.

9. The apparatus of claim 8, wherein the circuit board is secured to said mounting studs by mechanical fasteners.

10. The apparatus of claim 6, wherein said main body, base, cover, and movable elements comprise a non-conductive material.

11. The apparatus of claim 10, wherein said non-conductive material comprises a plastic material.

12. The apparatus of claim 11, wherein said non-conductive material comprises nylon.

13. The apparatus of claim 6, wherein said cover is pivotally connected with said main body.

14. The apparatus of claim 6, wherein said projections are frictionally retained within said sockets.

15. A network interface device, comprising:
  a housing having a main body, a cover, and a back member;
  a base attached to said back member, said base including a plurality of sockets;
  a plurality of movable elements for engaging with said sockets, said movable elements each including projections dimensioned to be inserted into said sockets, and wherein said device has more sockets than movable elements;
  a circuit board supported on said base with one or more fastening mechanisms; and
  communication equipment including one or more wires which are electrically connected to said circuit board, wherein said movable elements provide support to said circuit board while said wires are being electrically connected to said circuit board.

16. The device of claim 15, wherein said fastening mechanisms include mounting studs and guide posts.

17. The apparatus of claim 16, wherein the circuit board is secured to said mounting studs by mechanical fasteners.

18. The apparatus of claim 15, wherein said main body, base, cover, and movable elements comprise a non-conductive material.

19. The apparatus of claim 18, wherein said non-conductive material comprises a plastic material.

20. The apparatus of claim 19, wherein said non-conductive material comprises nylon.

21. The apparatus of claim 15, wherein said projections are frictionally retained within said sockets.

22. A method of installing a network interface device, said method comprising the steps of:
  securing a housing to a structure, said housing including a main body, a back member, a base, and a cover;
  securing one or more movable elements with relation to selected sockets in said base, wherein said movable elements each include projections dimensioned to be inserted into said sockets;
  securing a circuit board to said base with one or more fastening mechanisms; and
  connecting communication wires to the circuit board, wherein said movable elements are located to support said circuit board during said connecting.

23. The method of claim 22, wherein said connecting step comprises inserting said communication wires into one or more insulation deflection connectors located on said circuit board, said movable elements being positioned adjacent said insulation deflection connectors.

24. The method of claim 23, further comprising updating the network interface device, said updating step comprising:
  removing said circuit board;
  providing additional insulation deflection connectors on said circuit board; and
  providing additional movable elements in said sockets of said base adjacent to said additional insulation deflection connectors.

* * * * *